(12) United States Patent
Wang et al.

(10) Patent No.: US 12,426,153 B2
(45) Date of Patent: Sep. 23, 2025

(54) TWISTED DIFFERENTIAL COMPENSATION FOR ROUTING HIGH-SPEED SIGNALS NEAR POWER DELIVERY INDUCTORS AND SYSTEM MINIATURIZATION

(71) Applicant: Intel Corporation, Santa Clara, CA (US)

(72) Inventors: Long Wang, El Dorado Hills, CA (US); Ranjul Balakrishnan, Bangalore (IN); Stephen H. Hall, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 17/461,675

(22) Filed: Aug. 30, 2021

(65) Prior Publication Data

US 2021/0392743 A1 Dec. 16, 2021

(51) Int. Cl.
| | |
|---|---|
| *H05K 1/02* | (2006.01) |
| *G06F 1/18* | (2006.01) |
| *G06F 13/42* | (2006.01) |
| *H05K 1/11* | (2006.01) |
| *H05K 1/18* | (2006.01) |

(52) U.S. Cl.
CPC ........... *H05K 1/0245* (2013.01); *G06F 1/184* (2013.01); *G06F 1/188* (2013.01); *G06F 13/4282* (2013.01); *H05K 1/115* (2013.01); *H05K 1/18* (2013.01); *G06F 2213/0026* (2013.01); *G06F 2213/0042* (2013.01); *H05K 2201/1003* (2013.01)

(58) Field of Classification Search
CPC .......... H05K 1/02; H05K 1/0245; H05K 1/11; H05K 1/115; H05K 1/18; H05K 1/181–188; G06F 1/184–189; G06F 1/26
USPC ........................ 361/775–787, 792–795, 803; 333/114–116, 128, 12, 204
See application file for complete search history.

(56) References Cited

U.S. PATENT DOCUMENTS

| | | | | |
|---|---|---|---|---|
| 5,430,247 | A * | 7/1995 | Bockelman | H01L 23/528 |
| | | | | 174/250 |
| 6,396,000 | B1 * | 5/2002 | Baum | H05K 1/0228 |
| | | | | 174/262 |
| 6,510,058 | B1 * | 1/2003 | Kozakiewicz | H05K 9/0039 |
| | | | | 361/828 |
| 7,627,043 | B2 * | 12/2009 | Horowitz | H04B 3/32 |
| | | | | 375/257 |

(Continued)

*Primary Examiner* — Tuan T Dinh
(74) *Attorney, Agent, or Firm* — Compass IP Law PC

(57) ABSTRACT

Apparatus and methods employing twisted differential compensation for routing high-speed signals near power delivery inductors. Traces used for a high-speed differential signal including a P trace and an N trace are routed through one or more layers in a multi-layer printed circuit board (PCB) substrate and employ a twisted portion proximate to the centerline of an inductor under which portions of the P and N traces are swapped horizontally in a layer parallel to the top plane and/or are swapped vertically by swapping layers. The signal paths are routed such that a level of noise inductively coupled into the P trace and the N trace from the inductor is approximately equally. Stripline structures are used for signals that are routed under an inductor, while stripline and microstrip structures are used for signals routed adjacent to an inductor.

20 Claims, 9 Drawing Sheets

(56) References Cited

U.S. PATENT DOCUMENTS

| | | | | |
|---|---|---|---|---|
| 8,742,859 B2* | 6/2014 | Jin | ................. | H03B 5/1268 |
| | | | | 336/200 |
| 9,131,604 B1* | 9/2015 | Watt | ................. | H05K 1/0245 |
| 10,254,499 B1* | 4/2019 | Cohen | ................. | G02B 6/50 |
| 10,426,023 B2* | 9/2019 | Li | ................. | H03H 19/002 |
| 10,470,296 B2* | 11/2019 | Miyasaka | ............ | H05K 1/0245 |
| 2007/0052512 A1* | 3/2007 | Jeon | ................. | H01F 21/12 |
| | | | | 336/200 |
| 2011/0305060 A1* | 12/2011 | Ichimura | ................. | G11C 5/063 |
| | | | | 365/63 |

* cited by examiner $v_{noise_P} > v_{noise_N}$

Fig. 2a *(prior art)*

$v_{noise_P} \approx v_{noise_N}$

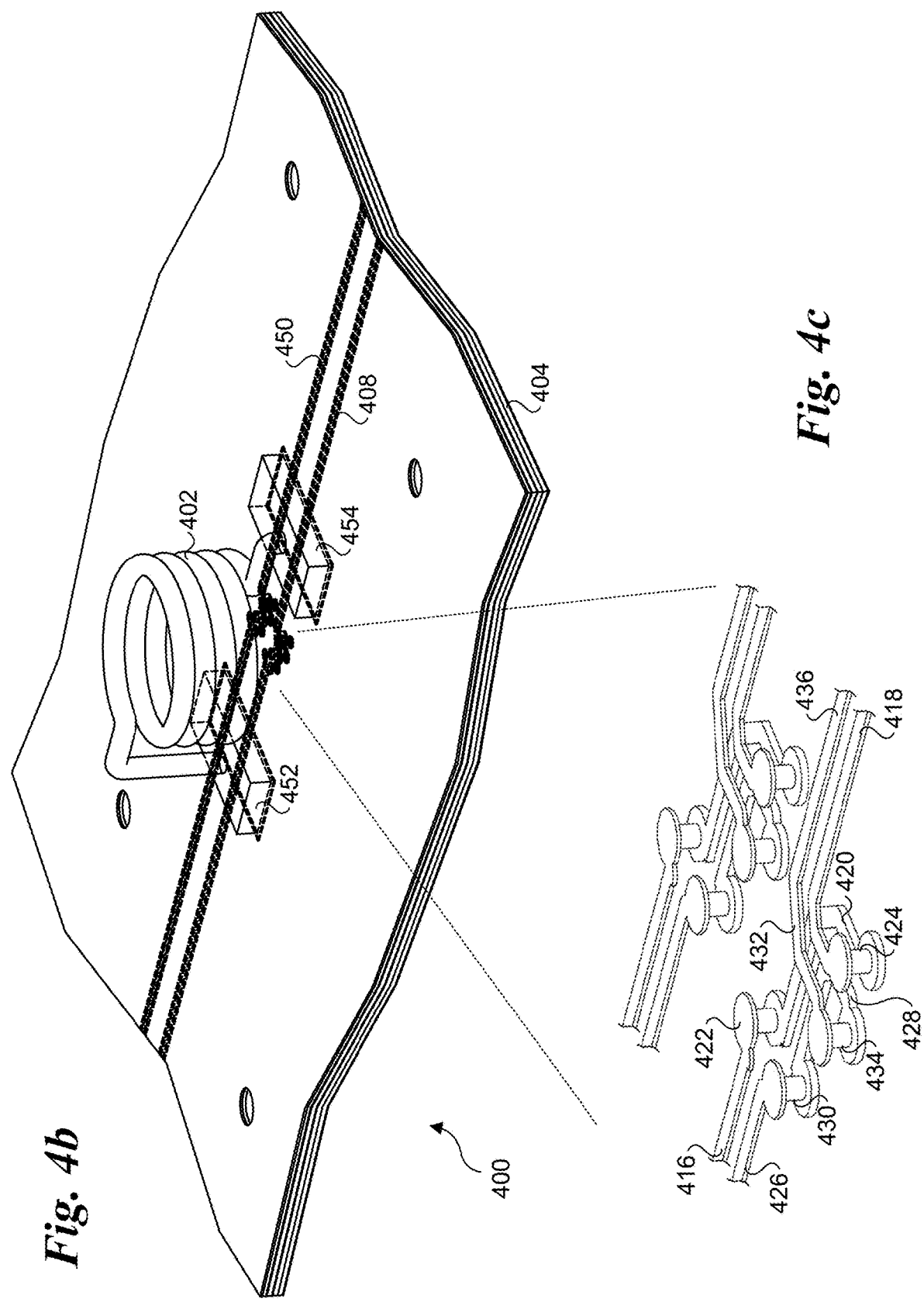

TWISTED DIFFERENTIAL COMPENSATION FOR ROUTING HIGH-SPEED SIGNALS NEAR POWER DELIVERY INDUCTORS AND SYSTEM MINIATURIZATION

BACKGROUND INFORMATION

Market trends are leading to small sized and thin, high performance computer systems in a variety of form factors. The physical size of these systems requires that high-current power delivery components, such as inductors, be placed near high-speed data buses.

High current flowing through the inductors generates large amounts of magnetic noise that couple onto the high-speed buses and cause functional failures. This magnetic noise cannot be effectively shielded by copper planes. This necessitates a large keep out zone (KOZ) surrounding the inductors (8-13 mm) in X/Y dimensions, which limits routing lanes. This can significantly increase board area and/or increase layer count, leading to larger z-heights and higher costs. The large KOZ is applicable to both single ended (e.g., DDR, GDDR) and differential (PCIe (Peripheral Component Interconnect Express), USB (Universal Serial Bus), display) buses.

An example of the KOZ is depicted in FIG. 1. As show, when current flows through the coils in spiral inductor 100, a magnetic field is generated. Under the SI system, the unit of inductance is the henry (H), and thus the magnetic field is labeled 'H' field in FIG. 1. The inductance of the magnetic field is stronger closest to the inductor, and also varies with the current flow and direction. For example, for a sinusoidal alternating current (AC) the strength of the magnetic field will likewise be sinusoidal.

Spiral inductor 100 is mounted to a printed circuit board (PCB) 102 including a top plane (such as a copper ground plane) and circuit traces 104 in one or more inner layers below the top plane in the PCB. The magnetic "noise" produced by the inductor is inductively coupled into circuit traces 104. The level of inductive coupling may adversely alter signals within the KOZ (less so outside of the KOZ), resulting in signal quality failing to meet requirements defined by applicable standards (such as for communication signals like PCIe).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 2a is a diagram illustrating an example of conventional routing for differential signal under which the noise coupled into the P trace is greater than the noise coupled into the N trace;

FIG. 4b is a diagram illustrating a 3D view of the PCB assembly of FIG. 4a;

FIG. 4c is a diagram illustrating a 3D view of the signal path routing of FIGS. 4a and 4b;

DETAILED DESCRIPTION

Figure 1:
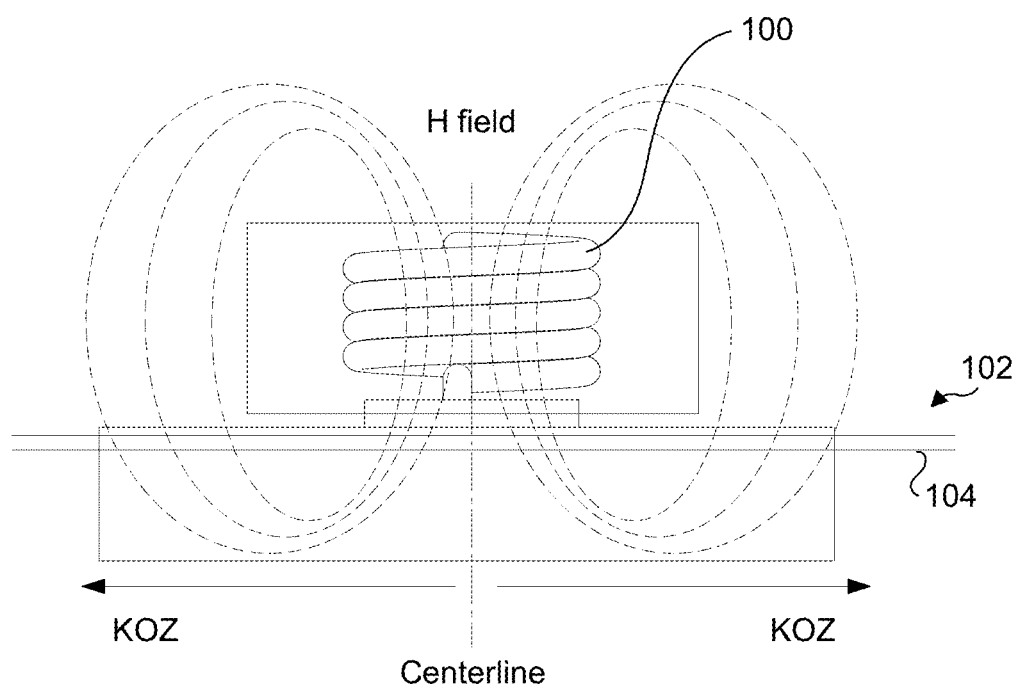
FIG. 1 is a diagram illustrating an example of a keep out zone (KOZ)

Embodiments of apparatus and methods employing twisted differential compensation for routing high-speed signals near power delivery inductors are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

In accordance with aspects of the embodiments disclosed herein, apparatus and methods are provided that allow high-speed differential signals to be routed significantly closer to (or under) power delivery inductors. This, in turn, permits the size of small form factor systems to be reduced. In one aspect, the embodiments utilize vias to make the differential signals "twisted" proximate to the midpoint of an inductor footprint. The technique can be extended to multiple differential pair routed in parallel, where the twisting occurs proximate to a centerline of the inductor that is perpendicular to the routing traces.

The embodiments provide several advantages. For example, they allow differential high-speed stripline signals to be routed underneath inductors. They also allow microstrip differential pairs to be routed significantly closer to inductors. This enables small form factor compute devices and systems to be implemented with a smaller motherboard (or other PCB) with a lower layer count that is not possible with current design practices.

As described and illustrated herein, the techniques may be applied to both differential stripline signals and microstrip differential pairs. A stripline is sometimes compared to a flattened coaxial cable in that, like the cable, it consists of an inner conductor surrounded by dielectric material which is further surrounded by a ground braid or foil. However, stripline circuits are planar, so that they appear as a sandwich of conductors in the middle, surrounded by dielectric layers, which in turn have parallel ground planes on the top and bottom. Microstrip is a transmission-line format in which the conductor is fabricated on a dielectric substrate which itself has a bottom ground-plane layer. Conductors are usually formed by etching away unwanted metal from a conductor layer, such as copper. As a variant of a microstrip structure is an embedded microstrip, which has another layer of dielectric above the microstrip traces.

For differential signals, two stripline structures may be used. Under an edge-coupled stripline structure, the traces for a pair of differential signals are in the same layer. Under a broad-side stripline structure, the traces for the pair of signals are stacked on top of each other in respective routing layers separated by a dialect layer.

Differential signaling is very effective for removing common mode noise. For example, assume that noise with a magnitude of $v_{noise}$ is coupled equally onto both legs of a differential pair (P and N). The output of a differential amplifier with unity gain is shown by (1), which removes the common mode noise.

$$v_{diff}=(v_P+v_{noise})-(v_N+v_{noise})=v_P-v_N \quad (1)$$

Because the magnitude of the magnetic field induced by transient current flowing through an inductor falls off quickly, the half of the differential pair in closer proximity to the inductor will see more inductively coupled noise. For example, as shown under the current approach in FIG. 2a, the P half of the conventional differential pair will see more noise compared to the N side. This results in a differential noise, $v_{diff\_noise}$, that depends on the proximity of the routing, inductor type and current profile as shown in equation (2), where $v_{diff\_noise}=v_{noise_P}-v_{noise_N}$.

$$v_{diff}=(v_P+v_{noise_P})-(v_N+v_{noise_N})=v_P-v_N+v_{diff\_noise} \quad (2)$$

Note that $v_{diff\_noise}$ can be as high as 10 mV per inductor, which is larger than the minimum eye height requirements of the PCIe 4, 5 and 6 specifications.

Figure 2B:
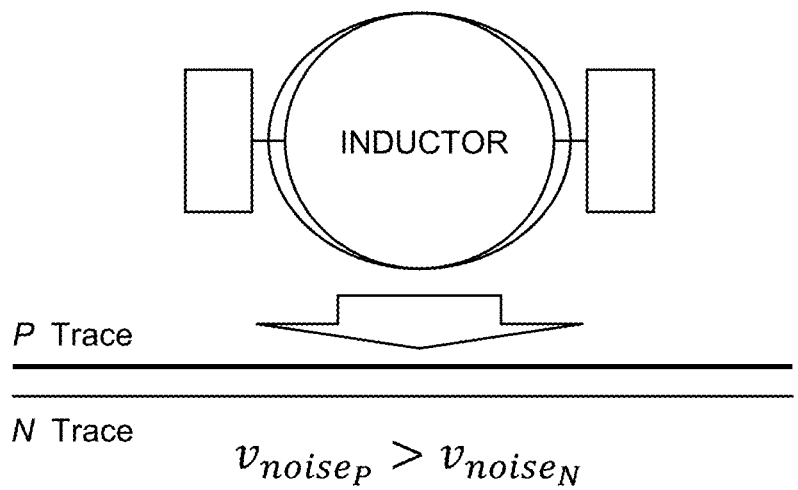
FIG. 2b is a diagram illustrating an example of twisted routing for differential signal under which the noise coupled into the P trace and the N trace are approximately equal.
Figure 2B:
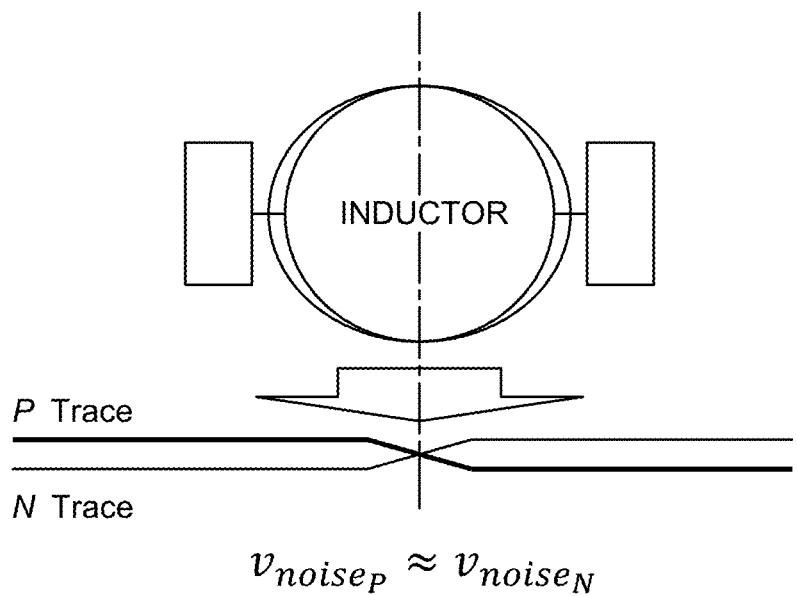

Under the novel approach provided by the embodiments disclosed herein, a "twist" is introduced in the differential pair by swapping the P and N traces near the centerline of the inductor so that the total coupled noise on each half of the differential pair is approximately equal. A high-level illustration of this approach is shown in FIG. 2b. In this example, (as with FIG. 2a, the relation of the traces can be considered in two different ways. For example, consider the FIG. 2a represents a cross-section view of an inductor mounted on a PCB using a broad-side stripline structure, where Trace_p begins (from left-to-right) in a PCB layer above Trace_n and they are swapped near the centerline of the inductor such that Trace_n is now in the upper layer and Trace_p is in the lower layer. Alternatively, FIG. 2b shows a plan (top) view of an inductor with Trace_p and Trace_n in the same layer, where the horizontal distance relative to a horizontal line passing through the center of the inductor is swapped near the centerline.

The result of the differential noise using the approach shown in FIG. 2b is shown in equation (3), where the non-primed and the primed variables denote the coupled noise before and after the twist respectively.

$$v_{diff}=(v_P+\tfrac{1}{2}v_{noise_P}+\tfrac{1}{2}v'_{noise_N})-(v_N+\tfrac{1}{2}v_{noise_N}+\tfrac{1}{2}v'_{noise_P}) \quad (3)$$

If the twist is introduced near the centerline of the inductor, then $v_{noise_P} \approx v_{noise_P}'$ and $v_{noise_N} \approx v_{noise_N}'$, reducing (3) to (4), resulting in the elimination of the differential magnetic noise coupled from the inductor to the differential pair:

$$v_{diff}=v_P-v_N \quad (4)$$

Figure 3:
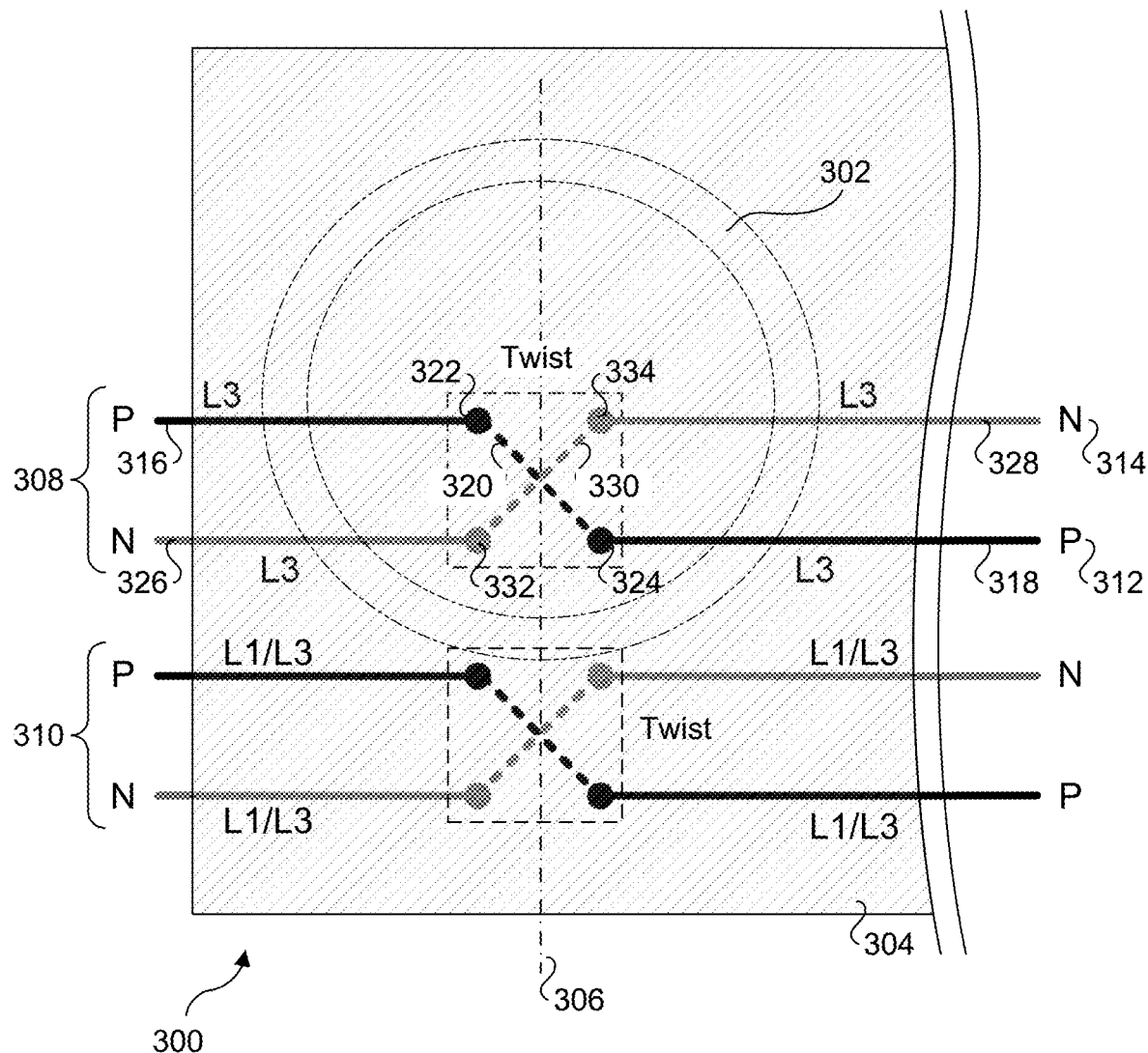
FIG. 3 is a diagram of a PCB assembly illustrating an abstracted view of an example of twisting applied to differential signal traces implemented in the same plane.

FIG. 3 shows a PCB assembly 300 illustrating an abstracted view of an example of twisting applied to differential signal traces implemented in the same plane. PCB assembly 300 includes an inductor 302 mounted to (or otherwise disposed over) a PCB 304 shown in plan (top) view, with inductor 302 outlined in phantom lines and having a vertical (Y-axis) centerline 306. The central axis of inductor 302 would be substantially perpendicular to the top plane of PCB 304 (and the page) and pass through it. PCB assembly 300 includes two sets of differential pair signal traces 308 and 310, which may be implemented using microstrips (for differential pair signal traces 310) or striplines (for either of differential pair signal traces 308 and 310) in alternative embodiments.

Differential pair signal traces 308 includes a P trace 312 and an N trace 314. P trace 312 includes a first leg 316 coupled to a second leg 318 using a cross-over segment 320 and vias 322 and 324. N trace 314 includes a first leg 326 coupled to a second leg 328 using a cross-over segment 330 and vias 332 and 334. In this illustrative example, the legs of P trace 312 and N trace 314 are implemented in layer 3 (L3), and at least a portion of a cross-over segment comprises a trace in layer 5 (L5). The term "cross-over" is used to describe a trace segment that crosses over between P legs or crosses over between N legs. Under a physical system, such as illustrated in FIGS. 4a-4c below, one of the two cross-over segments will cross under the other cross-over segment.

In PCB assembly 300, differential pair signal traces 308 pass under inductor 302, while differential pair signal traces 310 are offset horizontally (in L3) from differential pair signal traces 308 and do not pass under inductor 302. The crossover (twisting) of the P and N traces occurs proximate to inductor centerline 306. Differential pair signal traces 310 are adjacent to the footprint of inductor 302. Differential pair signal traces 310 has a similar configuration as differential pair signal traces 308, except that the legs in signal traces 310 may be implemented on either layer 1 (L1) when using microstrips or L3 when using striplines. The spacing between the pairs of P and N traces, width of the traces, and size of the vias is exaggerated for clarity. Three-dimensional (3D) views showing further details of an exemplary trace and via routing structures to effect twisting of the P and N traces are shown in FIGS. 4b and 4c.

Figure 4A:
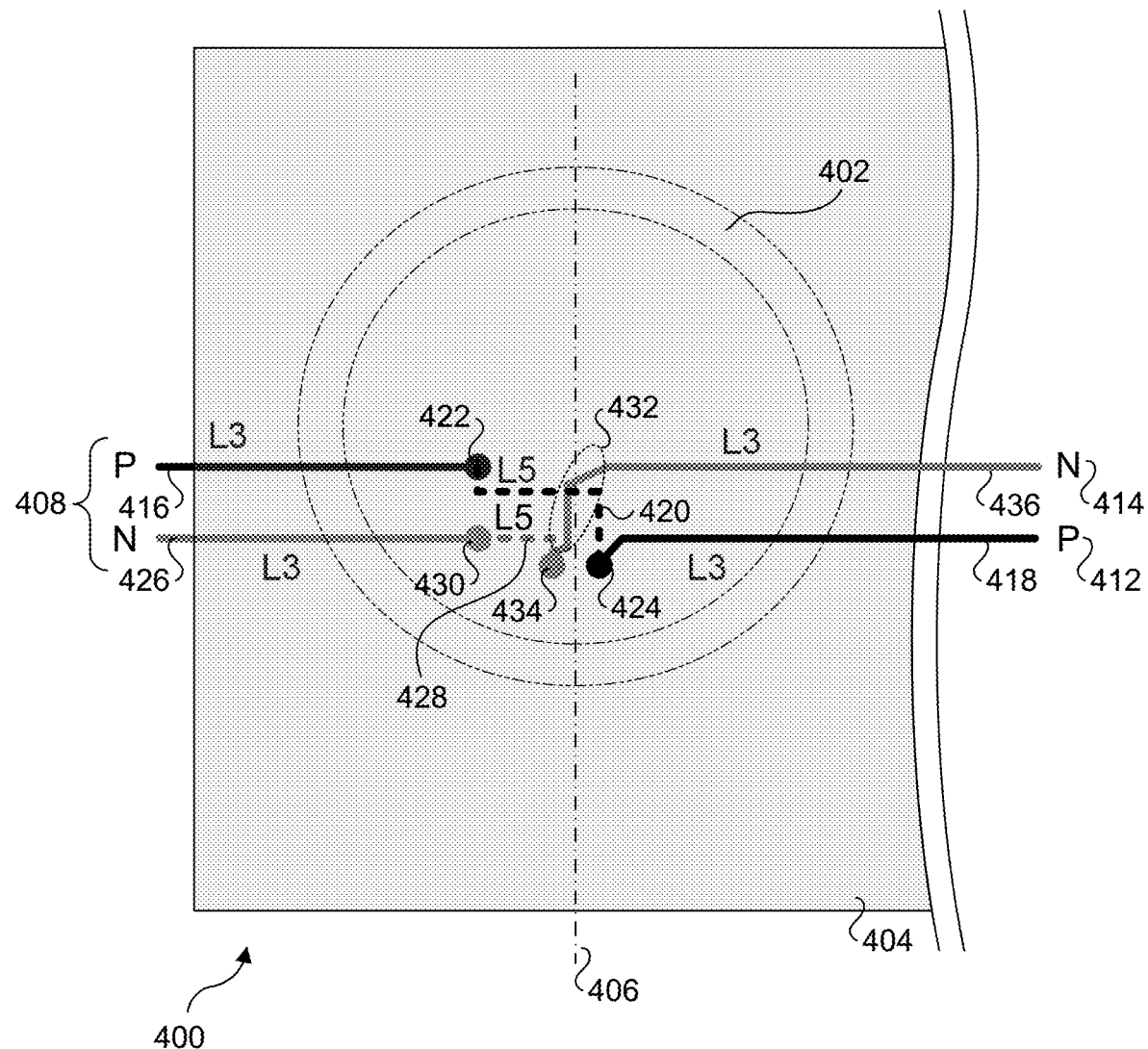
FIG. 4a is a diagram of a PCB illustrating an example of a physical implementation employing twisting applied to differential signal traces deposited in the same plane.

FIG. 4a shows a PCB assembly 400 illustrating an example of a physical implementation employing twisting applied to differential signal traces deposited in the same plane. PCB assembly 400 includes an inductor 402 mounted to (or otherwise disposed over) a PCB 404 shown in plan (top) view, with inductor 402 outlined in phantom lines and having a vertical (Y-axis) centerline 406. PCB assembly 400 includes a set of differential pair signal traces 408, which may be implemented using striplines. Differential pair signal traces 408 includes a P trace 412 and an N trace 414. P trace 412 includes a first leg 416 coupled to a second leg 418 using a cross-over segment 420 and vias 422 and 424. N trace 414 includes a first leg 426 coupled to lower layer segment 428 at a via 430. Lower layer segment 428 is coupled to a cross-over segment 432 at a via 434 that is part of a second leg 436. In this illustrative example, the legs of P trace 412 and N trace 414 are implemented in layer 3 (L3), and cross-over segment comprises a stripline trace in layer 5 (L5). Lower layer segment 428 is also implemented in L3.

FIG. 4b shows a 3D view of PCB assembly 400, with the addition of a second differential pair of P and N signal traces 450, which have similar structure to differential pair signal traces 408. Inductor 402 is mounted to PCB 404 at mounts 452 and 454. FIG. 4c shows a 3D view of the crossover portions of differential pair signal traces 408 and 450 (toward the rear with unlabeled structural elements).

As shown in FIG. 4c (and also shown in FIG. 4a), the cross-over segment 432 of the N signal is implemented in L3, while the cross-over segment 420 of the P trace is implemented in L5. On initial review, lower leg segment 428 would appear unnecessary, as cross-over segment 432 and N trace leg 426 are both in L3. However, this would result in a shorter path for the N signal than the P signal. It would also expose the N signal path to different inductive coupling than the P signal path and the signal paths might have slightly different impedance. Thus, both the signal paths for the P and N signals include a pair of vias and a trace segment that is implemented in L5, as shown in FIGS. 4a and 4c.

It is noted that a microstrip circuit structure similar to that shown in FIGS. 4a-4c may be implemented in layers L1 and L3 for differential signals that are routed adjacent to an inductor rather than under the inductor. For an embedded microstrip structure, layer L2 and L4 may be used.

Figure 5:
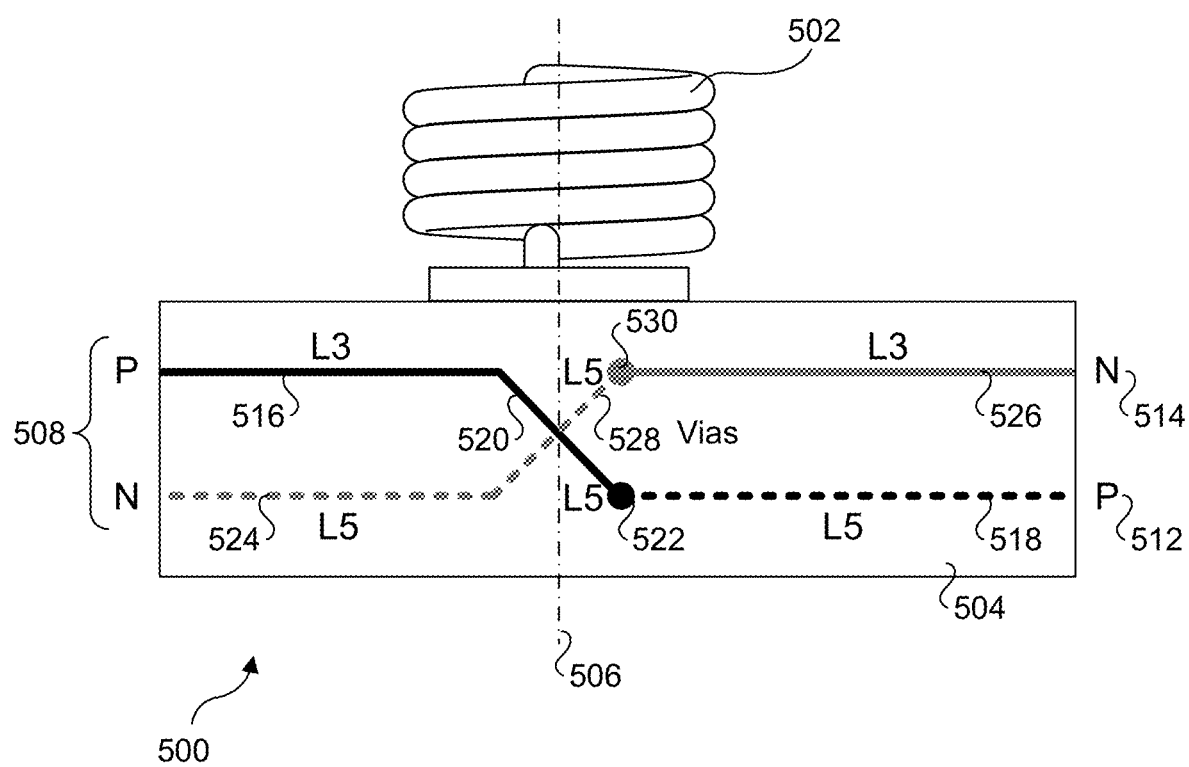
FIG. 5 is a diagram of a PCB assembly illustrating an abstracted view of an example of twisting applied to differential signal traces implemented in the different layers.

In addition to routing differential signals in the same plane (having legs in the same PCB layer), differential signals may be routed using traces in different layers. For example, FIG. 5 shows an elevation (side) view of a PCB assembly 500 illustrating an abstracted view of an example of twisting applied to differential signal traces implemented in different layers. PCB assembly 500 includes an inductor 502 mounted to (or otherwise disposed over) a PCB 504, with inductor 502 outlined in phantom lines and having a central axis 506. When the view would be rotated to a plan view, centerline of inductor 302 would be perpendicular to central axis 506. The central axis of inductor 302 would be substantially perpendicular to the top plane of PCB 304 and pass through it (not shown).

PCB assembly 500 includes a differential pair or signal traces 508, which may be implemented using striplines in the illustrated embodiment. Differential pair signal traces 508 includes a P trace 512 and an N trace 514. P trace 512 includes a first leg 516 coupled to a second leg 518 using a cross-over segment 520 and a via 522. N trace 514 includes a first leg 524 coupled to a second leg 526 using a cross-over segment 528 and a vias 530. In this illustrative example, the P trace leg 516 and N trace leg are implemented in layer L3 while N trace leg 524 and P trace leg 518 are implemented in Layer L5. 526 of P trace 512 and N trace 514 are implemented in layer 3 (L3). Vias 522 and 530 are used to route signal paths between layers L3 and L5.

The signal paths for the differential pair of P and N signals may also be twisted such that their distance from the inductor is swapped in the horizontal plane (not shown). The objective, as before, is for the level of noise inductively coupled into the signal paths for the P and N signals to be the same.

Figure 6:
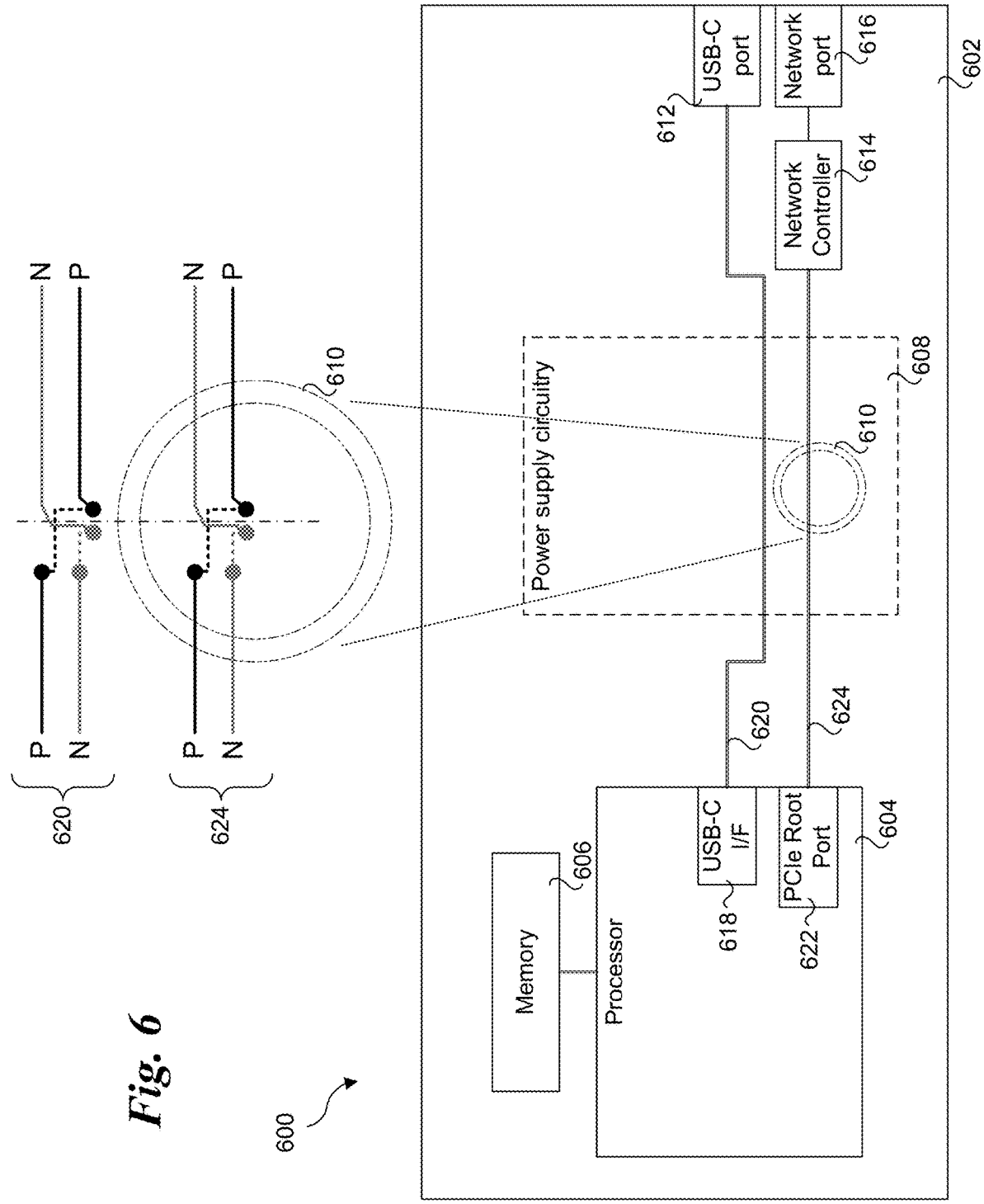
FIG. 6 is a diagram of an exemplary compute device in which twisted routing of differential signals is implemented.

FIG. 6 shows an example compute device 600 in which high-speed differential signals are routed using twisting. Compute device 600 includes a multilayer PCB 602 to which hardware components are mounted and having traces and vias for providing power planes and for signal routing. The hardware components include a processor 604, memory 606, power supply circuitry including an inductor 610, a USB-C port 612, a network controller 614, and a network port 616. Processor 604 includes a USB-C interface (I/F) 618 that is coupled to USB-C port 612 via differential signal pair traces 620, which are routed adjacent to the footprint of inductor 610. Processor 604 also includes a PCIe root port 622 that is coupled to network controller 614 via differential signal pair traces 620, which are routed under inductor 610. As shown in the blow-up of the portion including inductor 610 at the top of FIG. 7, differential signal pair traces 620 and 624 employ a twist structure that is similar to that shown in FIGS. 4a and 4c.

Figure 7A:
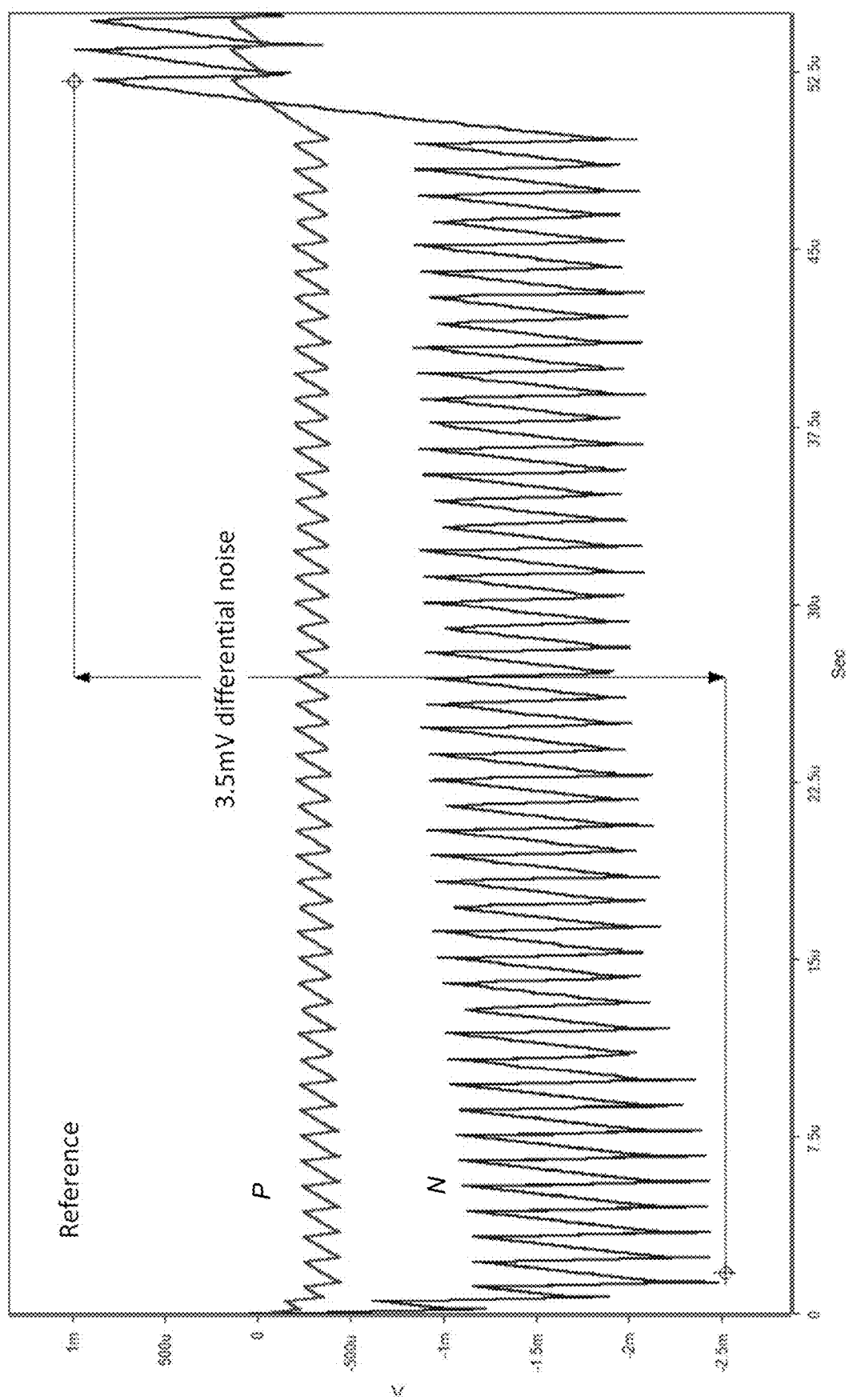
FIG. 7a is a graph showing noise coupled into a P trace and N trace using conventional routing proximate to an inductor.
Figure 7B:
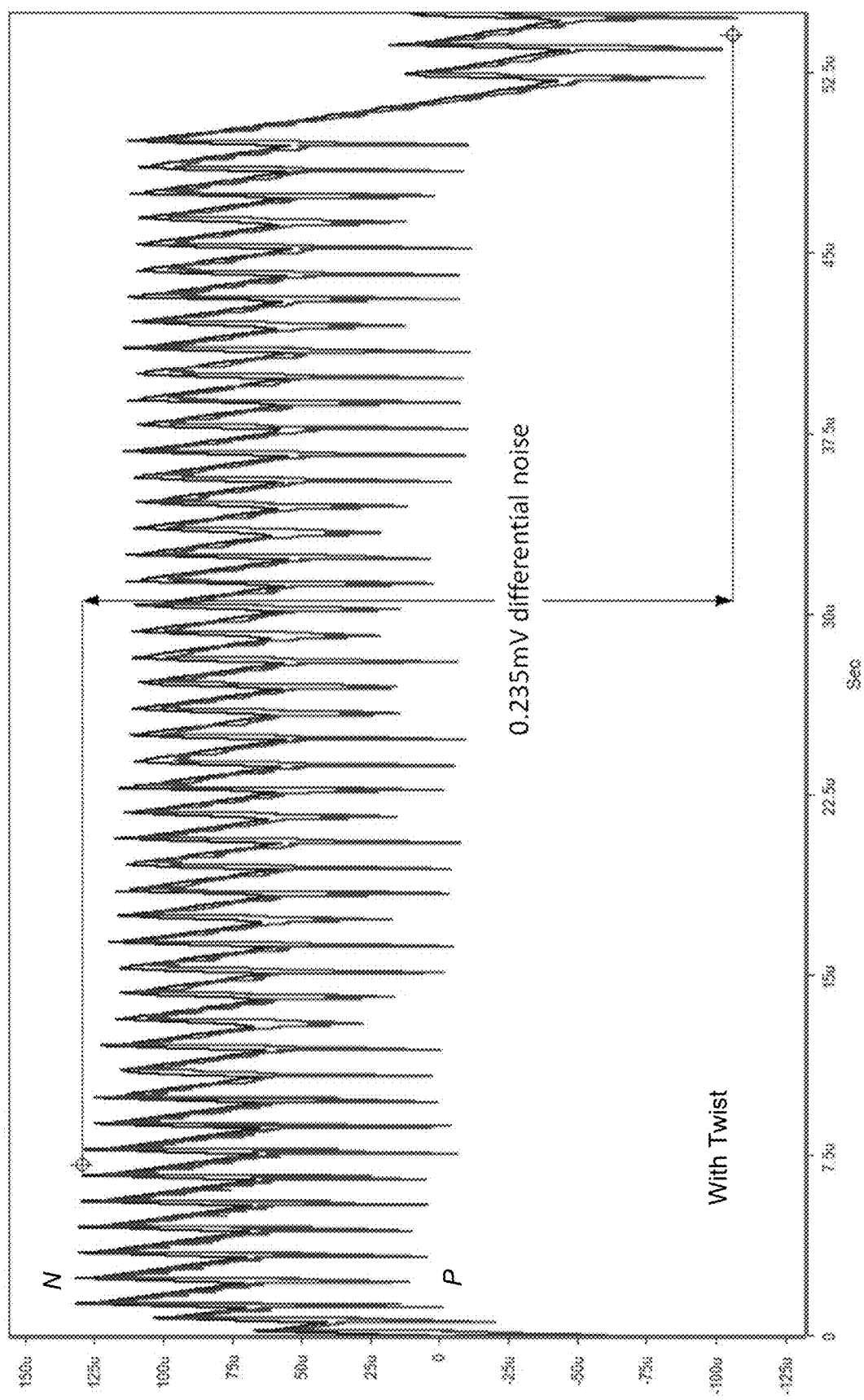
FIG. 7b is a graph showing noise coupled into a P trace and N trace using twisted routing proximate to an inductor.

FIGS. 7a and 7b shows signal noise graphs for P and N signals using a conventional approach and with twisting. As shown under the conventional approach in FIG. 7a, the N signal path is routed closer to the inductor than the P signal path. As a result, the level of inductively coupled noise for the N signal is significantly greater than for the P signal. By comparison, the difference in the level of inductively coupled noise for the P and N signals using the twisting approach is substantially reduced, as shown in FIG. 7b.

While the techniques disclosed and illustrated herein may be applied to various systems and devices, they are particularly well-suited for thin and small form factor compute devices. By enabling high-speed signals to be routed under inductors and/or proximate to inductors, the size of such systems and devices may be reduced.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A printed circuit board (PCB) assembly, comprising:
   a PCB comprising a multi-layer substrate and including a top plane to which an inductor is operatively coupled, the inductor having a central axis disposed perpendicular to the top plane and having a centerline projected onto the top plane,
   the PCB further including a plurality of traces including a differential pair of traces comprising a P trace and an N trace, wherein each of the P trace and N trace are routed through one or more layers in the multi-layer substrate and employ a twisted portion proximate to the centerline of the inductor under which portions of the P and N traces are swapped horizontally in a layer parallel to the top plane or are swapped vertically by swapping layers.

2. The PCB assembly of claim 1, wherein a level of noise induced by the inductor and coupled into the P trace and the N trace is approximately equal.

3. The PCB assembly of claim 1, wherein the P trace includes a first leg in a first layer coupled to a second leg in the first layer, and wherein the N trace includes a first leg in the first layer coupled to a second leg in the first layer, wherein the first leg of the P trace and the first leg of the N trace are substantially parallel and the first leg of the P trace is closer to the central axis of the inductor than the first leg of the N trace, and wherein the second leg of the P trace and the second leg of the N trace are substantially parallel and the second leg of the N trace is closer to the central axis of the inductor than the second leg of the P trace.

4. The PCB assembly of claim 3, wherein the first and second legs of the P trace and the first and second legs of the N trace comprise microstrips that are routed horizontally adjacent to a footprint of the inductor.

5. The PCB assembly of claim 3, wherein the first and second legs of the P trace and the first and second legs of the N trace comprise edge-coupled striplines that are routed underneath at least a portion of the inductor.

6. The PCB assembly of claim 1, wherein the P trace includes a first leg in a first layer coupled to a second leg in a second layer using a first via, and wherein the N trace includes a first leg in the second layer coupled to a second leg in the first layer using a second via.

7. The PCB assembly of claim 6, wherein the first leg of the P trace and the first leg of the N trace are substantially parallel and the first leg of the P trace is closer to the central axis of the inductor than the first leg of the N trace, and wherein the second leg of the P trace and the second leg of the N trace are substantially parallel and the second leg of the N trace is closer to the central axis of the inductor than the second leg of the P trace.

8. The PCB assembly of claim 6, wherein the P trace and the N trace are routed under a least a portion of the inductor.

9. The PCB assembly of claim 1, wherein the inductor comprises a power delivery inductor.

10. The PCB assembly of claim 1, wherein the P trace and N trace are configured to be used for transmitting a high-speed differential signal in accordance with Peripheral Component Interconnect express (PCIe) standard, a Universal Serial Bus (USB) standard, or a display signal standard.

11. A method for routing differential signals in a printed circuit board (PCB) comprising a multi-layer substrate and including a top plane to which an inductor is operatively coupled, the inductor having a central axis disposed perpendicular to the top plane and having a centerline projected onto the top plane, the method comprising:
    routing a P signal of the differential signals along a first signal path comprising a P trace; and
    routing a N signal of the differential signals along a second signal path comprising an N trace,
    wherein each of the P trace and N trace are routed through one or more layers in the multi-layer substrate and employ a twisted portion proximate to the centerline of the inductor under which portions of the P and N traces are swapped and the traces are configured such that a level of noise induced by the inductor and coupled into the P trace and the N trace is approximately equal.

12. The method of claim 11, wherein the P trace includes a first leg in a first layer coupled to a second leg in the first layer, and wherein the N trace includes a first leg in the first layer coupled to a second leg in the first layer, wherein the first leg of the P trace and the first leg of the N trace are substantially parallel and the first leg of the P trace is closer to the central axis of the inductor than the first leg of the N trace, and wherein the second leg of the P trace and the second leg of the N trace are substantially parallel and the second leg of the N trace is closer to the central axis of the inductor than the second leg of the P trace.

13. The method of claim 12, wherein the first and second legs of the P trace and the first and second legs of the N trace comprise microstrips that are routed horizontally adjacent to a footprint of the inductor.

14. The method of claim 12, wherein the first and second legs of the P trace and the first and second legs of the N trace comprise edge-coupled striplines that are routed underneath at least a portion of the inductor.

15. The method of claim 11, wherein the P trace includes a first leg in a first layer coupled to a second leg in a second layer using a first via, and wherein the N trace includes a first leg in the second layer coupled to a second leg in the first layer using a second via.

16. A compute device comprising:
a processor, including a high-speed input-output (IO) interface, mounted to a printed circuit board (PCB) comprising a multi-layer substrate having a plurality of layers and having a plurality of traces and vias formed therein including power and ground traces used to provide power to components in the compute device including the processor;
a power supply circuit comprising a plurality of components mounted to the PCB including an inductor having a central axis disposed perpendicular to a top plane of the PCB and having a centerline projected onto the top plane, the power supply circuit having outputs coupled to the power and ground traces,
wherein the plurality of traces in the PCB include a differential pair of traces comprising a P trace and an N trace being routed through one or more layers in the multi-layer substrate and employ a twisted portion proximate to the centerline of the inductor under which portions of the P and N traces are swapped horizontally in a layer parallel to the top plane or are swapped vertically by swapping layers, and
wherein the P trace and the N trace are coupled between the high-speed IO interface on the processor and one of an interface of an I/O component or a high-speed IO connector mounted or operatively coupled to the PCB.

17. The compute device of claim 16, wherein a portion of the P and N traces is routed under the inductor.

18. The compute device of claim 16, wherein the P and N traces are routed in signal paths adjacent to the inductor.

19. The compute device of claim 16, wherein the P trace and N trace are configured to be used for transmitting a high-speed differential signal in accordance with Peripheral Component Interconnect express (PCIe) standard, a Universal Serial Bus (USB) standard, or a display signal standard.

20. The compute device of claim 16, wherein the compute device includes traces for multiple high-speed differential signals that are routed using a twisted portion proximate to the centerline of the inductor.

* * * * *